United States Patent
Ohashi et al.

(10) Patent No.: US 6,274,251 B1
(45) Date of Patent: Aug. 14, 2001

(54) SEMICONDUCTOR ENCAPSULATING EPOXY RESIN COMPOSITION AND SEMICONDUCTOR DEVICE

(75) Inventors: Kenji Ohashi; Tatsuya Ishizaki, both of Atsugi; Masayuki Umeno, Chigasaki; Eiichi Asano, Usui-gun; Kazutoshi Tomiyoshi, Usui-gun; Shoichi Osada, Usui-gun; Toshio Shiobara, Usui-gun, all of (JP)

(73) Assignees: Hokko Chemical Industry Co., Ltd.; Shin-Etsu Chemical Co., Ltd., both of Tokyo (JP)

( * ) Notice: Subject to any disclaimer, the term of this patent is extended or adjusted under 35 U.S.C. 154(b) by 0 days.

(21) Appl. No.: 09/337,520

(22) Filed: Jun. 22, 1999

(30) Foreign Application Priority Data

Jun. 25, 1998 (JP) .................................................. 10-195068
Sep. 24, 1998 (JP) .................................................. 10-287232

(51) Int. Cl.⁷ ........................... C09D 163/00; C08L 63/00
(52) U.S. Cl. .......................... 428/620; 523/466; 525/481; 525/485; 525/489
(58) Field of Search ..................................... 525/481, 489, 525/485; 523/466; 428/620

(56) References Cited

U.S. PATENT DOCUMENTS 5,473,091  12/1995  Ichiroku et al. .

FOREIGN PATENT DOCUMENTS

| 56-45491 | 10/1981 | (JP) . |
|---|---|---|
| 173253 | * 7/1995 | (JP) . |
| 7-242683 | 9/1995 | (JP) . |
| 025334 | * 1/1997 | (JP) . |
| 208669 | * 8/1997 | (JP) . |
| 216936 | * 8/1997 | (JP) . |

* cited by examiner

Primary Examiner—David J. Buttner
(74) Attorney, Agent, or Firm—Millen, White, Zelano & Branigan, P.C.

(57) ABSTRACT

An epoxy resin composition contains (A) an epoxy resin, (B) a phenolic resin curing agent, (C) a curing catalyst, and (D) an inorganic filler. The catalyst is a quaternary phosphorus compound or a quaternary phosphorus compound which has been mixed and reacted with a phenolic resin having at least two hydroxyl groups. The composition is effectively flowable, moldable and curable and thus suitable for semiconductor encapsulation.

12 Claims, No Drawings

SEMICONDUCTOR ENCAPSULATING EPOXY RESIN COMPOSITION AND SEMICONDUCTOR DEVICE

This invention relates to an epoxy resin composition for semiconductor encapsulation having improved moldability, curability, and shelf stability, and a semiconductor device encapsulated with a cured product of the composition.

BACKGROUND OF THE INVENTION

The current mainstream in the semiconductor industry resides in diodes, transistors, ICs, LSIs and VLSIs of the resin encapsulation type. Epoxy resins are generally used as the encapsulating resin because they have superior moldability, adhesion, electrical properties, mechanical properties, and moisture resistance to other thermosetting resins. It is thus a common practice to encapsulate semiconductor devices with epoxy resin compositions.

In the epoxy resin compositions, curing catalysts are often blended in order to enhance the reactivity of epoxy resins with curing agents. Phosphorus compounds, imidazole compounds, and amine compounds are well known as the curing catalysts. Of these, phosphorus compounds are commonly used because they afford cured products which are highly reliable in terms of moisture resistance or the like, as compared with the imidazole and amine compounds.

To comply with the recent demand for electronic equipment of reduced size and weight, the trend is to reduce the outer dimensions, especially thickness of packages. In order that resin compositions be molded around such thin packages, the resin compositions must have a sufficiently low viscosity and be effectively curable and mold releasable.

Of the phosphorus curing catalysts, triphenyl-phosphine and tetraphenylphosphonium tetraphenylborate are well known and commonly used. Because of low catalytic activity, triphenylphosphine must be blended in epoxy resin compositions in so large amounts that when molded, the resulting high viscosity compositions tend to give rise to troubles such as wire flow, pad shift, void formation, and short molding. Tetraphenylphosphonium tetraphenylborate has lower catalytic activity than triphenylphosphine and is thus difficult to endow resin compositions with sufficient curability even when blended in considerably large amounts. The curing catalysts blended in large amounts give rise to a problem that reaction can take place even at temperatures near room temperature. The resin compositions accordingly increase their viscosity and become less stable during shelf storage.

JP-B 56-45491 discloses an epoxy resin composition comprising an epoxy resin and a curing agent, having good shelf stability and affording highly moisture resistant cured products. The curing agent is obtained by heat treating a mixture of a novolac type phenolic resin and tetraphenylphosphonium tetraphenylborate at a temperature above the softening point of the phenolic resin until the resin is colored slightly yellowish brown or dark brown. However, since this curing catalyst yet has low activity and lacks fast curing ability, it must be used in a large amount at the sacrifice of the shelf stability of the epoxy resin composition.

In JP-A 7-242683 corresponding to U.S. Pat. No. 5,473,091, the same assignee as the present invention proposed an epoxy resin composition having blended therein a curing catalyst which is obtained by mixing for reaction a quaternary phosphorus compound with a compound having phenolic hydroxyl groups at a temperature of 120 to 250° C. This epoxy resin composition is still insufficient with respect to low viscosity, good cure, smooth mold release, and shelf stability.

SUMMARY OF THE INVENTION

An object of the invention is to provide a semiconductor-encapsulating epoxy resin composition having improved moldability, cure, and shelf stability, and a semiconductor device encapsulated with a cured product of the composition.

We have found that an epoxy resin composition comprising an epoxy resin, a phenolic resin curing agent, and an inorganic filler is improved in moldability, curability, and shelf stability by blending a quaternary phosphorus compound of the following general formula (1) as a curing catalyst.

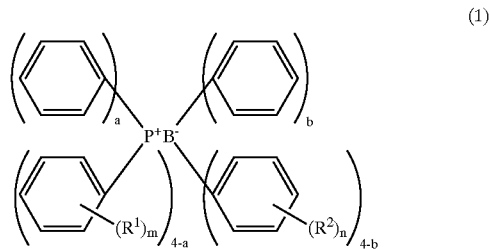

Herein $R^1$ and $R^2$ are independently selected from the group consisting of alkyl groups having 1 to 4 carbon atoms and alkoxy groups having 1 to 4 carbon atoms, each of m and n is an integer of 1 to 3, a is an integer of 1 to 3, and b is an integer of 1 to 4. Similar effects are exerted when a mixed reaction product obtained by mixing for reaction at a temperature of 100 to 250° C. a phenolic resin having at least two phenolic hydroxyl groups in the molecule with the quaternary phosphorus compound of formula (1) is blended as a curing catalyst. This epoxy resin composition is effective for semiconductor encapsulation. A semiconductor device encapsulated with the composition in a cured state is highly reliable.

Therefore, the present invention provides a semiconductor-encapsulating epoxy resin composition comprising (A) an epoxy resin, (B) a phenolic resin curing agent, (C) a curing catalyst, and (D) an inorganic filler. The curing catalyst (C) is the quaternary phosphorus compound of formula (1) or its mixed reaction product with a phenolic resin having at least two phenolic hydroxyl groups.

DESCRIPTION OF THE PREFERRED EMBODIMENTS

Component (A) of the epoxy resin composition according to the invention is an epoxy resin which has at least two epoxy groups in one molecule and can be cured with various curing agents to be described later. The epoxy resin is not particularly limited in molecular structure, molecular weight and the like, and any appropriate one may be selected from a variety of known epoxy resins. Examples of the epoxy resin which can be used herein include novolac type epoxy resins such as phenol novolac type epoxy resins and cresol novolac type epoxy resins; triphenolalkane type epoxy resins and polymers thereof such as triphenolmethane type epoxy resins and triphenolpropane type epoxy resins; biphenyl skeleton-bearing epoxy resins; naphthalene skeleton-bearing epoxy resins; dicyclopentadiene-phenol novolac resins; phenolaralkyl type epoxy resins; glycidyl ester type epoxy resins; alicyclic epoxy resins; heterocyclic epoxy resins; bisphenol type epoxy resins such as bisphenol A type epoxy resins and bisphenol F type epoxy resins. These epoxy resins may be used alone or in admixture of two or more.

The curing agent (B) is a phenolic resin having at least two phenolic hydroxyl groups in one molecule. Examples of the phenolic resin curing agent include novolac type phenolic resins such as phenol novolac resins and cresol novolac resins; resol type phenolic resins; phenolaralkyl type phenolic resins; triphenolalkane type phenolic resins and polymers thereof such as triphenol-methane type phenolic resins and triphenolpropane type phenolic resins; bisphenol type phenolic resins such as bisphenol A type phenolic resins and bisphenol F type phenolic resins; naphthalene ring-bearing phenolic resins; biphenyl skeleton-bearing phenolic resins; and dicyclopentadiene-modified phenolic resins. These curing agents may be used alone or in admixture of two or more.

The epoxy resin (A) and the curing agent (B) are blended in any desired ratio insofar as the amount of the curing agent is effective for curing. They are preferably blended in such a ratio that 0.5 to 1.5 mol, especially 0.8 to 1.2 mol of phenolic hydroxyl groups in the phenolic resin (B) is available per mol of epoxy groups in the epoxy resin (A).

In the embodiment wherein a preliminary reaction product of a quaternary phosphorus compound with a phenolic resin is used as the curing catalyst (C') as will be described later, the components are blended such that the molar ratio of entire phenolic hydroxyl groups in both the phenolic resin used in the preliminary reaction and the phenolic resin added as the curing agent to epoxy groups in the epoxy resin may fall within the above-defined range of from 0.5 to 1.5, especially from 0.8 to 1.2.

In the practice of the invention, another curing agent such as an amine compound or acid anhydride may be blended if desired.

In the epoxy resin composition of the invention serving as an encapsulant for semiconductor devices, an inorganic filler (D) is blended to reduce the coefficient of thermal expansion thereof for reducing the stress applied to the semiconductor device. Any of inorganic fillers commonly used in conventional epoxy resin compositions may be used. Typical inorganic fillers are fused silica in ground (fragmental) or spherical shape and crystalline silica while alumina, silicon nitride, aluminum nitride, boron nitride, titanium oxide, and glass fibers are also useful as the filler. For complying with the reduced expansion of cured products and moldability at the same time, it is preferable to use a mixture of spherical and fragmental fillers or a spherical filler alone. The inorganic filler preferably has a mean particle size of about 3 to 40 μm, preferably about 5 to 30 μm. The mean particle size may be determined as the weight average value (median diameter) using a particle size distribution measurement apparatus based on the laser light diffraction technique.

To enhance the bond strength between the resin and the inorganic filler, it is preferred to previously surface treat the inorganic filler with a suitable agent, typically a silane coupling agent before the filler is blended with the resin. The type and amount of the coupling agent and the surface treating method are not critical.

No particular limit is imposed on the amount of the inorganic filler blended. Preferably about 200 to 1,200 parts, especially about 400 to 1,000 parts by weight of the inorganic filler is blended per 100 parts by weight of the epoxy resin and the curing agent combined. On this basis, a composition loaded with less than 200 parts of the filler would have a higher coefficient of expansion, with a risk of greater stresses being applied to semiconductor devices and thus deteriorating the characteristics thereof. A composition loaded with more than 1,200 parts of the filler would have an increased viscosity and thus become difficult to mold.

According to the invention, a quaternary phosphorus compound of the general formula (1) is used as a curing catalyst (C) for promoting the curing reaction of the epoxy resin (A) with the curing agent (B).

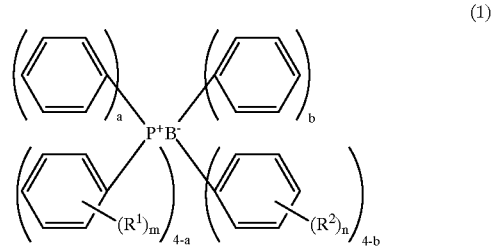

(1)

In formula (1), each of $R^1$ and $R^2$, which may be the same or different, is an alkyl group having 1 to 4 carbon atoms or alkoxy group having 1 to 4 carbon atoms, each of m and n is an integer of 1 to 3, a is an integer of 1 to 3, and b is an integer of 1 to 4.

As $R^1$ and $R^2$ in formula (1), exemplary alkyl groups are methyl, ethyl, propyl, isopropyl, butyl, isobutyl, and tert-butyl and exemplary alkoxy groups are methoxy, ethoxy, propoxy, and butoxy. The $R^1$ groups may be the same or different, the $R^2$ groups may be the same or different, and $R^1$ may be the same or different from $R^2$. Letter a is an integer of 1 to 3, and b is an integer of 1 to 4. If a is equal to 0 or 4, then the organic phosphorus compound has insufficient catalytic activity and its symmetry becomes stronger to raise the melting point, which obstructs the mixing reaction to be described later.

Examples of the quaternary phosphorus compound of formula (1) are illustrated by compounds of the following structures. They may be used alone or in admixture of two or more. It is noted that in the following formulae, Ph is phenyl, Me is methyl, Et is ethyl, and $^tBu$ is tert-butyl.

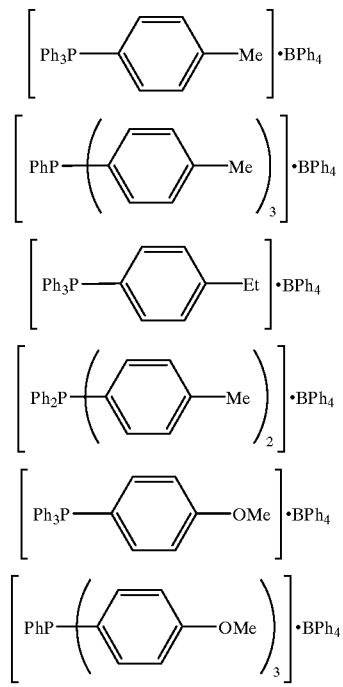

-continued

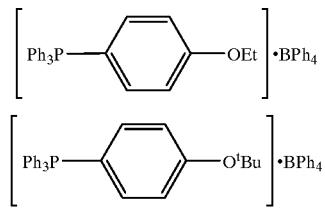

Of the quaternary phosphorus compounds of formula (1), the compound of the following formula (2) is especially preferable because epoxy resin compositions having excellent moldability, curability, and shelf stability are obtained.

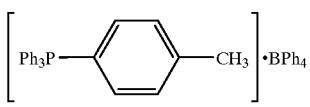

(2)

In the epoxy resin composition of the invention, the quaternary phosphorus compound of formula (1) can be blended as such. However, it is recommended to blend in the composition a curing catalyst which is obtained by mixing for reaction at a temperature of 100 to 250° C., preferably 100 to 200° C., the quaternary phosphorus compound of formula (1) with a phenolic resin having at least two phenolic hydroxyl groups in the molecule as part of component (B). That is, it is recommended that the quaternary phosphorus compound of formula (1) is mixed and reacted with a phenolic resin having at least two phenolic hydroxyl groups in the molecule at a temperature of 100 to 250° C. If the quaternary phosphorus compound of formula (1) is added to the epoxy resin composition without subjecting it to the preliminary mixing reaction, there is a possibility that the compound exerts relatively weak catalysis and fails to endow the resin composition with sufficient curability even when blended in a so large amount.

The compounds having at least two phenolic hydroxyl groups in one molecule to be used in the preliminary mixing reaction may be phenolic resins as exemplified for component (B) and commonly used in conventional epoxy resin compositions. Illustrative, non-limiting examples include novolac type phenolic resins such as phenol novolac resins and cresol novolac resins, resol type phenolic resins, phenolaralkyl resins, triphenolalkane type phenolic resins and polymers thereof, naphthalene ring-bearing phenolic resins, biphenyl skeleton-containing phenolic resins, and dicyclopentadiene-modified phenolic resins. These phenolic resins may be used alone or in admixture of two or more.

The preliminary mixing reaction of the quaternary phosphorus compound of formula (1) with the phenolic resin as part of the curing agent (B) preferably uses about 1 to 20 parts, especially about 2 to 10 parts by weight of the phenolic resin per part by weight of the quaternary phosphorus compound. With less than 1 part by weight of the phenolic resin per part by weight of the quaternary phosphorus compound, the mixing reaction would not uniformly proceed because of an increased melt viscosity. With more than 20 parts by weight of the phenolic resin per part by weight of the quaternary phosphorus compound, the curing catalyst has a low concentration of the quaternary phosphorus compound and sometimes fails to achieve the object even when blended in plenty in epoxy resin compositions.

The mixing reaction results in a curing catalyst in which the aryl groups attached to the boron atom in the quaternary phosphorus compound of formula (1) are eliminated and instead, the residue in which a proton is removed from a phenolic hydroxyl group in the phenolic resin, that is, an $-O^{\ominus}$—(aromatic ring) group is attached to the boron atom. The production rate of the curing catalyst is slow at reaction temperatures below 100° C. Reaction temperatures above 250° C. cause decomposition reaction of the quaternary phosphorus compound of formula (1), inhibiting the formation of the end curing catalyst in high yields.

It is noted that the mixing reaction is preferably carried out in an inert atmosphere such as nitrogen. If oxygen is present in the reaction system, it can oxidize and thus decompose the quaternary phosphorus compound. A solvent is used in the mixing reaction if necessary. Exemplary solvents include alcohols such as ethanol, propanol, butanol, and cyclohexanol, ketones such as methyl ethyl ketone and methyl isobutyl ketone, toluene, and xylene.

The mixing reaction generally continues for about ½ to 10 hours. After the solvent is removed, the reaction product is cooled and ground, obtaining the end curing catalyst.

The curing catalyst is preferably blended in the epoxy resin composition in such amounts that about 0.1 to 100 parts, especially about 0.5 to 50 parts by weight of the curing catalyst calculated as the quaternary phosphorus compound of formula (1) is available per 100 parts by weight of the epoxy resin and the phenolic resin curing agent combined. Less than 0.1 part of the curing catalyst would not fully promote curing whereas with more than 100 parts of the curing catalyst, the composition would become too viscous and difficult to mold.

The curing catalyst according to the invention is effective as a catalyst for assisting in curing of a resin composition comprising an epoxy resin and a phenolic resin. The use of the curing catalyst ensures to formulate an epoxy resin composition having a low viscosity, good cure, smooth mold release, and shelf stability.

Along with the above-mentioned curing catalyst, any of well-known curing catalysts can be added to the epoxy resin composition of the invention, if necessary, insofar as the objects of the invention are not impaired. Such well-known curing catalysts include imidazole and derivatives thereof, cycloamidine derivatives, and phosphine derivatives outside the scope of formula (1). Understandably, such a known curing catalyst may be previously admixed with the resin component, which is ground on use, in order that the curing catalyst be readily dispersed in the resin composition.

A variety of additives are blended in the semiconductor-encapsulating epoxy resin composition of the invention if necessary. Such additives include stress-reducing agents such as thermoplastic resins, thermoplastic elastomers, organic synthetic rubbers, and silicones; waxes such as carnauba wax, higher fatty acids, and synthetic waxes; flame retardants such as antimony oxide and halide compounds; colorants such as carbon black; and halogen trapping agents. These optional additives are added in conventional amounts insofar as the objects of the invention are not impaired.

The semiconductor-encapsulating epoxy resin composition of the invention is prepared by blending the epoxy resin, curing agent, curing catalyst, inorganic filler and additives in a predetermined compositional ratio, thoroughly and uniformly mixing them in a mixer or the like, and melt milling the mixture in a hot roll mill, kneader or extruder. The mixture is then cooled for solidification and comminuted to a suitable size, yielding a molding material.

The thus obtained epoxy resin composition of the invention is effectively used in the encapsulation of various semiconductor devices, such as ICs, LSIs, transistors, thyristors, and diodes. The most common technique for encapsulation is low-pressure transfer molding. Desirably, the epoxy resin composition is molded at about 150 to 180° C. for about 30 to 180 seconds and post cured at about 150 to 180° C. for about 2 to 16 hours.

There has been described a semiconductor-encapsulating epoxy resin composition comprising a curing catalyst in the form of a quaternary phosphorus compound of specific structure which is improved in shelf stability and molding properties including molding, cure and mold release. That is, the composition is effectively flowable and moldable so that it may be molded and cured around semiconductor devices without troubles such as wire flow, pad shift, void formation, and short molding. Semiconductor devices encapsulated with the cured composition are highly reliable in terms of moisture resistance, etc.

EXAMPLE

Examples of the invention are given below by way of illustration and not by way of limitation. All parts are by weight.

In Examples, Me is methyl group, Et is ethyl group and Ph is phenyl group, and pbw means "part by weight".

Preparation of curing catalysts

Curing catalysts (a) to (d) were prepared by mixing for reaction quaternary phosphorus compounds (A) to (D) with a phenolic resin, respectively.

In a nitrogen atmosphere, a 500-ml separable flask was charged with 10 g of quaternary phosphorus compound (A), 60 g of a phenol novolac resin DL-92 (Meiwa Chemicals K.K., phenol equivalent 110), and 10 g of 4-methyl-2-pentanone. The flask was heated while benzene as the by-product and 4-methyl-2-pentanone as the solvent were taken out of the system. Eventually, mixing reaction was effected at 200° C. for 3 hours in the nitrogen atmosphere. The reaction product was dried at 100° C. in a vacuum of 2 mmHg, cooled and comminuted, yielding a curing catalyst (a).

Curing catalysts (b) to (d) were similarly prepared by mixing reaction using quaternary phosphorus compounds (B) to (D), respectively.

quaternary phosphorus compound (A):

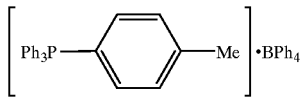

quaternary phosphorus compound (B):

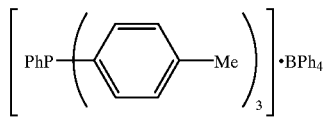

quaternary phosphorus compound (C):

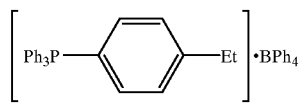

quaternary phosphorus compound (D):

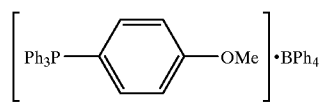

Examples 1–9 & Comparative Examples 1–3

The components shown in Tables 1 and 2 were uniformly melt milled in a hot twin-roll mill, cooled and comminuted, obtaining a series of epoxy resin compositions.

The epoxy resin compositions were examined for the following properties. The results are also shown in Tables 1 and 2.

(1) Spiral Flow

The spiral flow was measured according to EMMI standards by molding the composition in a mold at 175° C. and 70 kgf/cm$^2$ for 120 seconds.

(2) Gel Time

The gel time was measured as the time until the epoxy resin composition gelled on a hot plate at 175° C.

(3) Melt Viscosity

The melt viscosity was measured at 175° C. under a load of 10 kgf/cm$^2$ with a constant-load orifice-type flow testing apparatus of the kind known in Japan as a Koka-type flow tester.

(4) Hardness as Molded

According to JIS K6911, a rod measuring 100×10×4 mm was molded at 175° C. and 70 kgf/cm$^2$ for 90 seconds. The hardness when hot was measured with a Barcol Impressor.

(5) Glass transition temperature (Tg) and Expansion coefficient

Test specimens with dimensions of 4×4×15 mm were molded at 175° C. and 70 kgf/cm$^2$ for 120 seconds and post-cured at 180° C. for 4 hours. Measurement was carried out by heating the test specimen at a rate of 5° C./min in a dilatometer.

(6) Molding (voids and gold wire flow)

A silicon chip dimensioned 9×10×0.3 mm was joined to a die pad dimensioned 10×15 mm to construct 100-pin QFP (42 alloy) dimensioned 14×20×2.7 mm. Gold wires were bonded to the semiconductor part. Using an automatic transfer molding machine, an epoxy resin composition was molded over this semiconductor part at a temperature of 175° C., a pressure of 70 kgf/cm$^2$, and a transfer speed of 10 seconds. External voids and gold wire flow on the molded part were observed.

(7) Moisture Resistance

Silicon chips of 6×6 mm having aluminum wiring were joined to 14-pin DIP frames (42 alloy). Aluminum electrodes on the chip surface were wire bonded to lead frames using gold wires with a diameter of 30 μm. An epoxy resin composition was molded over these semiconductor parts at a temperature of 175° C. and a pressure of 70 kgf/cm$^2$ for 120 seconds and post cured at 180° C. for 4 hours. The thus prepared twenty packages were allowed to stand for 500 hours in an atmosphere of 140° C. and RH 85%, with a dc bias voltage of −5 V applied. Those packages in which aluminum corrosion occurred were counted.

(8) Shelf stability

An epoxy resin composition was sealed in an aluminum bag and allowed to stand for 168 hours in a thermostat chamber at 25° C. The aged composition was measured for spiral flow, from which a percent reduction from the initial value was calculated.

TABLE 1

|  | Example | | | | | |
|---|---|---|---|---|---|---|
|  | 1 | 2 | 3 | 4 | 5 | 6 |
| Composition (pbw) | | | | | | |
| Epoxy resin (A) | 57 | 57 | 57 | 57 | 57 | — |
| Epoxy resin (B) | — | — | — | — | — | 49 |
| Phenolic resin curing agent (C) | 23 | 23 | 23 | 23 | 17 | — |
| Phenolic resin curing agent (D) | — | — | — | — | — | 23 |
| Brominated epoxy resin | 8 | 8 | 8 | 8 | 8 | 4 |
| Antimony trioxide | 8 | 8 | 8 | 8 | 8 | 4 |
| Curing catalyst (a) | 14 | — | — | — | 21 | 28 |
| Curing catalyst (b) | — | 14 | — | — | — | — |
| Curing catalyst (c) | — | — | 14 | — | — | — |
| Curing catalyst (d) | — | — | — | 14 | — | — |
| Triphenylphosphine | — | — | — | — | — | — |
| Tetraphenylphosphonium tetraphenylborate | — | — | — | — | — | — |
| Quaternary phosphorus compound (A) | — | — | — | — | — | — |
| Inorganic filler | 550 | 550 | 550 | 550 | 550 | 800 |
| Carbon black | 2 | 2 | 2 | 2 | 2 | 2 |
| Parting agent | 3 | 3 | 3 | 3 | 3 | 3 |
| Silane coupling agent | 1 | 1 | 1 | 1 | 1 | 1 |
| Properties | | | | | | |
| Spiral flow (cm) | 90 | 88 | 93 | 90 | 80 | 100 |
| Gel time (sec) | 19 | 20 | 19 | 19 | 16 | 22 |
| Melt viscosity (poise) | 150 | 170 | 140 | 150 | 180 | 100 |
| Hardness as molded | 80 | 80 | 80 | 80 | 85 | 80 |
| Tg (° C.) | 160 | 160 | 160 | 160 | 165 | 125 |
| Coefficient of linear expansion ($10^{-5}$/° C.) | | | | | | |
| α1 | 1.2 | 1.2 | 1.2 | 1.2 | 1.2 | 1.0 |
| α2 | 5.2 | 5.2 | 5.2 | 5.2 | 5.2 | 3.7 |
| Moldability | | | | | | |
| Voids | 0/20 | 0/20 | 0/20 | 0/20 | 0/20 | 0/20 |
| Gold wire flow (%) | 1 | 1 | 1 | 1 | 1 | 1 |
| Moisture resistance | 0/20 | 0/20 | 0/20 | 0/20 | 0/20 | 0/20 |
| Shelf stability (%) | 95 | 93 | 95 | 95 | 90 | 90 |

TABLE 2

|  | Example | | | Comparative Example | |
|---|---|---|---|---|---|
|  | 7 | 8 | 9 | 1 | 2 |
| Composition (pbw) | | | | | |
| Epoxy resin (A) | — | — | 57 | 57 | 57 |
| Epoxy resin (B) | 49 | 49 | — | — | — |
| Phenolic resin curing agent (C) | — | — | 35 | 35 | 35 |
| Phenolic resin curing agent (D) | 23 | 23 | — | — | — |
| Brominated epoxy resin | 4 | 4 | 8 | 8 | 8 |
| Antimony trioxide | 4 | 4 | 8 | 8 | 8 |
| Curing catalyst (a) | — | — | — | — | — |
| Curing catalyst (b) | 28 | — | — | — | — |
| Curing catalyst (c) | — | — | — | — | — |
| Curing catalyst (d) | — | 28 | — | — | — |
| Triphenylphosphine | — | — | — | 1 | — |
| Tetraphenylphosphonium tetraphenylborate | — | — | — | — | 3 |
| Quaternary phosphorus compound (A) | — | — | 2 | — | — |
| Inorganic filler | 800 | 800 | 550 | 550 | 550 |
| Carbon black | 2 | 2 | 2 | 2 | 2 |
| Parting agent | 3 | 3 | 3 | 3 | 3 |
| Silane coupling agent | 1 | 1 | 1 | 1 | 1 |
| Properties | | | | | |
| Spiral flow (cm) | 95 | 100 | 130 | 60 | 140 |
| Gel time (sec) | 21 | 22 | 24 | 12 | 25 |
| Melt viscosity (poise) | 110 | 100 | 90 | 300 | 80 |
| Hardness as molded | 80 | 80 | 40 | 75 | 20 |
| Tg (° C.) | 125 | 125 | 160 | 160 | 160 |
| Coefficient of linear expansion ($10^{-5}$/° C.) | | | | | |
| α1 | 1.0 | 1.0 | 1.2 | 1.2 | 1.2 |
| α2 | 3.7 | 3.7 | 5.2 | 5.2 | 5.2 |
| Moldability | | | | | |
| Voids | 0/20 | 0/20 | 0/20 | 10/20 | 0/20 |
| Gold wire flow (%) | 1 | 1 | 1 | 5 | 1 |
| Moisture resistance | 0/20 | 0/20 | 0/20 | 0/20 | 0/20 |
| Shelf stability (%) | 90 | 90 | 85 | 60 | 70 |

Epoxy resin (A):
 o-cresol novolac type epoxy resin, EOCN1020-55 by Nippon Kayaku K.K., epoxy equivalent 200
Epoxy resin (B):
 biphenyl type epoxy resin, YX4000HK by Yuka Shell K.K., epoxy equivalent 190
Phenolic resin (C):
 phenol novolac resin, DL-92 by Meiwa Chemicals K.K., phenol equivalent 110
Phenolic resin (D):
 phenolaralkyl resin, MEH-7800SS by Meiwa Chemicals K.K., phenol equivalent 175
Brominated epoxy resin:
 phenol novolac type brominated epoxy resin, BREN-105 by Nippon Kayaku K.K., epoxy equivalent 280, bromine content 35%
Inorganic filler:
 spherical fused silica by Tatsumori K.K., mean particle size 20 μm
Parting agent:
 carnauba wax by Nikko Fine Products K.K.
Silane coupling agent:
 γ-glycidoxypropyltrimethoxysilane, KBM-403 by Shin-Etsu Chemical Co., Ltd.

It is evident that epoxy resin compositions comprising a curing catalyst of specific structure are effectively flowable, moldable and curable so that they can be molded and cured around semiconductor devices without troubles such as wire flow and voids. The compositions are also stable during storage. Semiconductor devices encapsulated with the cured compositions remain highly reliable in terms of moisture resistance, etc.

Japanese Patent Application Nos. 10-195068 and 10-287232 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An epoxy resin composition for semiconductor encapsulation comprising, in admixture, (A) an epoxy resin,
    (B) a phenolic resin curing agent,
    (C) a quaternary phosphorus compound of formula (1):

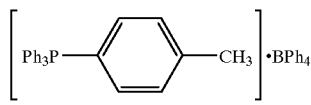

(2)

wherein each $R^1$ is independently an alkyl group having 1 to 4 carbon atoms or an alkoxy group having 1 to 4 carbon atoms, a is an integer of 1 to 3, and (D) an inorganic filler.

2. An epoxy resin composition for semiconductor encapsulation comprising, in admixture, (A) an epoxy resin,
    (B) a phenolic resin curing agent,
    (C') a curing catalyst obtained by mixing at a temperature of 100 to 250° C. a phenolic resin having at least two phenolic hydroxyl groups in the molecule with a quaternary phosphorus compound of formula (1):

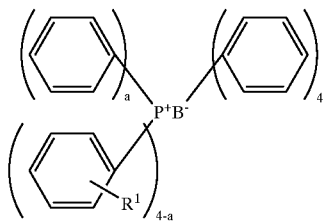

(1)

wherein each $R^1$ is independently an alkyl group having 1 to 4 carbon atoms or an alkoxy group having 1 to 4 carbon atoms, a is an integer of 1 to 3, and (D) an inorganic filler.

3. The composition of claim 2 wherein the curing catalyst (C') is obtained by mixing at a temperature of 100 to 250° C. a phenolic resin having at least two phenolic hydroxyl groups in the molecule with a quaternary phosphorus compound of the following general formula (2):

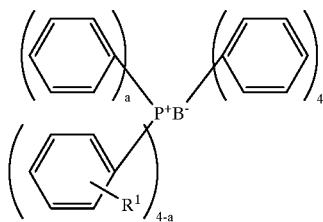

(1)

wherein Ph is phenyl.

4. A semiconductor device encapsulated with the epoxy resin composition of claim 1 in a cured state.

5. The epoxy resin according to claim 1, wherein (A) has at least two epoxy groups per molecule.

6. The epoxy resin according to claim 1, wherein (A) is a novolac epoxy resin, a cresol epoxy resin, a triphenolalkane epoxy resin, a biphenyl epoxy resin, a naphthalene epoxy resin, a dicyclopentadiene-phenol novolac resin, a phenolaralkyl epoxy resin, a glycidyl ester epoxy resin, an alicyclic epoxy resin, a heterocyclic epoxy resin, or a bisphenol epoxy resin.

7. The epoxy resin according to claim 6, wherein (A) is a phenol novolac epoxy resin, triphenolmethane epoxy resin, triphenolpropane epoxy resin, bisphenol A epoxy resin or bisphenol F epoxy resin.

8. The epoxy resin according to claim 1, wherein (B) is a novolac phenolic resin, a resol phenolic resin, a phenolaralkyl phenolic resin, a bisphenol alkane phenolic resin, a bisphenol phenolic resin, a naphthaline ring-bearing phenolic resin, a bisphenyl phenolic resin or a dicyclopentadiene phenolic resin.

9. The epoxy resin according to claim 1, wherein (C) is

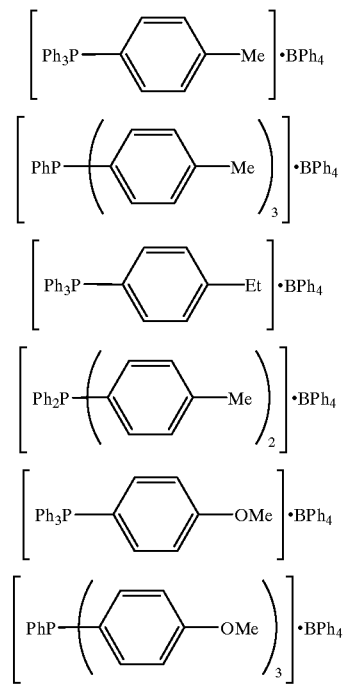

-continued

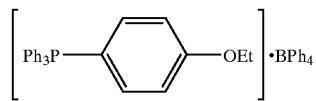

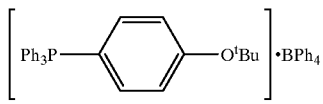

wherein Me is methyl, Et is ethyl and ᵗBu is tert-butyl.

10. The epoxy resin according to claim 1, wherein (C) is

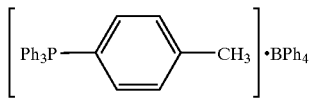

(2)

11. A process for preparing the epoxy resin according to claim 1, comprising blending the epoxy resin, curing agent, quaternary phosphorous compound, inorganic filler and additives in a predetermined compositional ratio, mixing, and optionally melt milling, cooling or comminuting.

12. A process for preparing a device according to claim 4, comprising coating a semiconductor device with the resin composition.

* * * * *